United States Patent
McGruer et al.

(10) Patent No.: US 6,836,394 B2
(45) Date of Patent: Dec. 28, 2004

(54) ELECTROSTATIC DISCHARGE PROTECTION FOR ELETROSTATICALLY ACTUATED MICRORELAYS

(75) Inventors: Nicol E. McGruer, Dover, MA (US); Paul M. Zavracky, Norwood, MA (US)

(73) Assignee: Northeastern University, Boston, MA (US)

( * ) Notice: Subject to any disclaimer, the term of this patent is extended or adjusted under 35 U.S.C. 154(b) by 124 days.

(21) Appl. No.: 10/220,910

(22) PCT Filed: Mar. 9, 2001

(86) PCT No.: PCT/US01/07654

§ 371 (c)(1), (2), (4) Date: Feb. 10, 2003

(87) PCT Pub. No.: WO01/67476

PCT Pub. Date: Sep. 13, 2001

(65) Prior Publication Data

US 2004/0125520 A1 Jul. 1, 2004

Related U.S. Application Data

(60) Provisional application No. 60/188,121, filed on Mar. 9, 2000.

(51) Int. Cl.[7] .................................................. H02H 9/00
(52) U.S. Cl. .......................... 361/56; 361/58; 361/111; 361/233
(58) Field of Search .................. 361/56, 58, 91.1, 361/111, 117, 118, 127, 233, 234, 220, 212

(56) References Cited

U.S. PATENT DOCUMENTS

| 5,258,591 A | 11/1993 | Buck .......................... 200/181 |
| 5,268,696 A | 12/1993 | Buck et al. ................. 342/372 |
| 5,367,137 A | 11/1994 | Buck .......................... 200/600 |
| 5,638,946 A | 6/1997 | Zavracky .................... 200/181 |
| 6,046,659 A | 4/2000 | Loo et al. ................... 333/262 |
| 6,153,839 A | 11/2000 | Zavracky et al. ........... 200/181 |

*Primary Examiner*—Stephen W. Jackson
(74) *Attorney, Agent, or Firm*—Weingarten, Schurgin, Gagnebin & Lebovici LLP

(57) ABSTRACT

Apparatus and methods for protecting devices such as micro-switches (100) and micro-relays from adverse effects of electrostatic discharge (ESD). A protection device is provided that includes a two terminal switch (102, 104) that can be actuated by an ESD event to protect an EDS-sensitive micro-switch or micro-relay from potential malfunction and/or damage. The two terminal switch is configured to close in less time than the micro-switch or micro-relay it is protecting, thereby dissipating the energy associated with the ESD event without causing damage to the micro-relays which are provided with increased immunity to the adverse effects of ESD events. The micro-switch includes respective drain/gate terminal pairs at respective ends of the device. The micro-relay includes at least two drain terminals (106) and a gate terminal (102) at respective ends of the device. The micro-switch and micro-relay are configured to be less sensitive to ESD events by using the gate terminal (104) at one end of the device to latch that end of the device down, thereby increasing the gate or drain voltage required to generate a threshold electric field to pull the other end of the device down.

20 Claims, 6 Drawing Sheets

ELECTROSTATIC DISCHARGE PROTECTION FOR ELETROSTATICALLY ACTUATED MICRORELAYS

CROSS REFERENCE TO RELATED APPLICATIONS

This application claims priority of U.S. Provisional Patent Application No. 60/188,121 filed Mar. 9, 2000 entitled ELECTROSTATIC DISCHARGE PROTECTION FOR ELECTROSTATICALLY ACTUATED MICRORELAYS.

STATEMENT REGARDING FEDERALLY SPONSORED RESEARCH OR DEVELOPMENT

N/A

BACKGROUND OF THE INVENTION

The present invention relates generally to micro-mechanical switches and relays, and more specifically to electro-statically actuated micro-switches and micro-relays that have reduced susceptibility to malfunction and/or damage from electrostatic discharge. The present invention further relates to protection devices for protecting electro-statically actuated micro-switches and micro-relays from adverse effects of electrostatic discharge.

Micro-mechanical switches and relays (also known as micro-switches and micro-relays) are frequently employed to route signals in electronic devices and systems. Such micro-switches and micro-relays typically comprise at least one source terminal, at least one gate terminal, at least one drain terminal, and various style beams mounted to a substrate. A respective beam is controlled by the gate terminal for selectively connecting the source terminal to the drain terminal (as in a conventional micro-switch device) or for selectively connecting two (2) drain terminals (as in a conventional micro-relay device). Such micro-switch and micro-relay devices are described in U.S. Pat. No. 6,153,839 issued Nov. 28, 2000 entitled MICRO-MECHANICAL SWITCHING DEVICES.

In recent years, micro-switch and micro-relay devices have become increasingly susceptible to malfunction and/or damage from application of excessive voltages resulting from, e.g., electrostatic discharge (ESD). This is due at least in part to the decreasing sizes of the devices as circuit geometries are scaled down.

During the manufacture and assembly of micro-switch and micro-relay devices, all terminals of the devices are typically ESD-sensitive. For example, electrostatic charge may be transferred from one or more terminals of a micro-switch or micro-relay device to another conducting object during the manufacture or assembly of the device. This charge may generate voltages that are large enough to cause the device to malfunction, breakdown the gate oxide on the device, or dissipate sufficient energy to produce electro-thermal failures in the device.

Moreover, when micro-switch and micro-relay devices are being used in the field, one or more drain terminals of the devices are often used to connect internal systems, which may be implemented on the same substrate as the device, to external systems. This exposes the drain terminals to potential ESD that may cause malfunction in and/or damage to the devices.

One approach to reducing the adverse effects of ESD during the manufacture and assembly of micro-switches and micro-relays is to require special handling of these devices. For example, such special handling may involve proper grounding of manufacturing and assembly personnel who come in contact with the devices, and/or the use of ESD-resistant containers for transporting the devices during the manufacturing and assembly processes. However, such specialized device handling is often expensive to implement and may increase manufacturing and assembly costs.

Another approach to reducing the effects of ESD not only during the manufacture and assembly of micro-switches and micro-relays but also when these devices are in-use is to have ESD protection built into the integrated circuits containing the devices. However, conventional ESD protection techniques used in integrated circuits, in general, are not always suitable for protecting micro-switch and micro-relay device structures. This may be because of constraints in the manufacturing process, or because the conventional ESD protection techniques may disturb the signal to be switched.

It would therefore be desirable to have devices such as micro-switches and micro-relays that are less susceptible to the adverse effects of ESD. Such devices would have reduced susceptibility to malfunction and/or damage from ESD during the manufacture and assembly of the devices and when the devices are being used in the field. It would also be desirable to have ESD protection devices that are suitable for protecting micro-switches and micro-relays.

BRIEF SUMMARY OF THE INVENTION

Apparatus and methods for protecting devices such as micro-switches and micro-relays from adverse effects of electrostatic discharge (ESD) are provided. In a first embodiment, a protection device is provided that includes a two (2) terminal switch that can be actuated by an ESD event to protect an ESD-sensitive micro-switch or micro-relay from potential malfunction and/or damage. The two (2) terminal switch is configured to close in less time than the micro-switch or micro-relay it is protecting, thereby dissipating the energy associated with the ESD event without causing damage to the micro-switch or micro-relay. In one embodiment, the two (2) terminal switch includes a source terminal, a drain terminal, and a beam mounted on a substrate. The drain terminal includes at least one drain contact, and the beam includes a first end attached to the source terminal and a second end overhanging the drain contact to define a drain contact overlap area. In a preferred embodiment, the drain contact overlap area of the protection device is configured to allow the two (2) terminal switch to close at a predetermined voltage and in less time than the micro-switch or micro-relay it is protecting.

The at least one drain contact of the protection device is configured to withstand the potentially damaging effects of the ESD event. In one embodiment, a respective current-limiting resistor in series with the at least one drain contact is employed in the protection device. In another embodiment, the protection device includes at least one first drain contact in a primary conducting path, at least one second drain contact in a high resistance path in parallel with the primary conducting path, and a respective current-limiting resistor in series with the at least one second drain contact. Respective drain contact overlap areas associated with the first and second drain contacts are configured to allow the high resistance path to close before the primary conducting path, thereby allowing the primary conducting path to close safely to provide a low resistance path for current flow. In alternative embodiments, increased numbers of drain contacts and/or different drain contact compositions are used in the protection device to resist damage from the ESD event.

In still another embodiment of the protection device, a gate terminal is employed to bias the two (2) terminal switch to make closure of the switch faster. The gate terminal can be further employed as a third terminal to maintain actuation of the two (2) terminal switch while the drain terminal removes excess electrostatic charge.

In a second embodiment, micro-switches and micro-relays are provided with increased immunity to the adverse effects of ESD events. The micro-switch includes respective drain/gate terminal pairs at respective ends of the device. The micro-relay includes at least two (2) drain terminals and a gate terminal at respective ends of the device. The micro-switch and micro-relay are configured to be less sensitive to ESD events by using the gate terminal at one end of the device to latch that end of the device down, thereby increasing the gate or drain voltage required to generate a threshold electric field to pull the other end of the device down. In alternative embodiments, this gate or drain voltage is further increased by adding contacts and/or bumpers to prevent contact between the beam and the gate terminal at the latched-down end of the device.

Other features, functions, and aspects of the invention will be evident from the Detailed Description of the Invention that follows.

BRIEF DESCRIPTION OF THE SEVERAL VIEWS OF THE DRAWING

The invention will be more fully understood with reference to the following Detailed Description of the Invention in conjunction with the drawings of which:

FIG. 1b is a perspective view of the conventional micro-switch of FIG. 1a;

FIG. 2b is a side view of the conventional micro-relay of FIG. 2a;

DETAILED DESCRIPTION OF THE INVENTION

U.S. Provisional Patent Application No. 60/188,121 filed Mar. 9, 2000 is incorporated herein by reference.

Apparatus and methods are disclosed for protecting micro-mechanical switches and relays (also known as micro-switches and micro-relays) from adverse effects of electrostatic discharge (ESD). In one embodiment, the presently disclosed apparatus comprises a protection device for protecting a micro-switch or micro-relay from potentially damaging ESD events. The protection device is a passive device including a two (2) terminal switch that is actuated by an ESD event. The two (2) terminal switch is configured to close in less time than the micro-switch or micro-relay it is protecting, thereby dissipating energy associated with the ESD event that might otherwise cause malfunction in and/or damage to the micro-switch or micro-relay.

In another embodiment, the presently disclosed apparatus comprises a micro-switch and micro-relay with increased immunity to ESD. Each micro-switch and micro-relay includes a gate terminal and at least one drain terminal at respective ends of the device. The micro-switch and micro-relay are configured to be less sensitive to ESD events by using the gate terminal at one end of the device to latch that end of the device down. Such a configuration increases the "pull-in voltage" required to generate a threshold electric field to pull the other end of the device down, thereby reducing the device's susceptibility to malfunction and damage during ESD events.

Figure 1A:
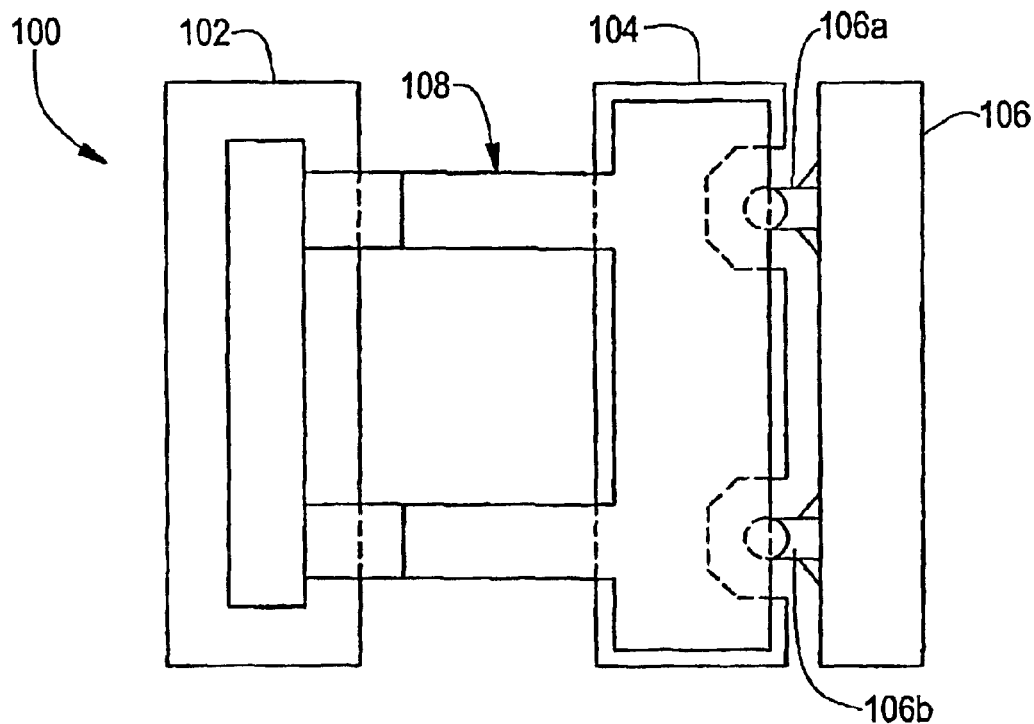
FIG. 1a is a top view of a conventional micro-switch.
Figure 1B:
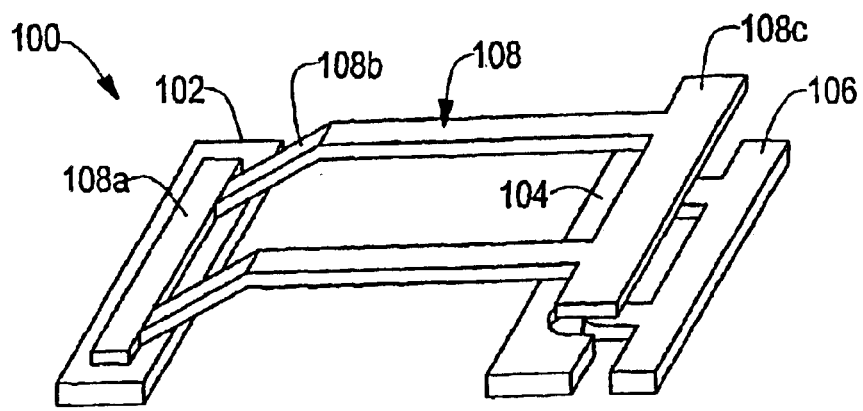

FIGS. 1a and 1b depict a conventional micro-switch 100 comprising a source terminal 102, a gate terminal 104, a drain terminal 106, and a conductive beam 108 mounted to a substrate (not shown). As shown in FIG. 1b, the beam 108 includes a fixed portion 108a fixedly attached to the source terminal 102 at a proximal end of the beam 108, and a contact portion 108c overhanging the gate terminal 104 at a distal end of the beam 108. It should be noted that at least the tip of the contact portion 108c overhangs the drain terminal 106. In the illustrated embodiment, the portion of the beam 108 extending from the source terminal 102 is split into two (2) parts and includes two (2) flexures 108b (see FIG. 1b).

The main part of the beam 108 is configured to be more rigid than the flexures 108b. Such rigidity of the main part of the beam 108 acts to prevent contact between the contact portion 108c of the beam 108 and the gate terminal 104, thereby improving the over-voltage factor of the micro-switch 100. It is noted that the over-voltage factor of a micro-switch or micro-relay may be defined as the ratio between the voltage at which the device's beam is pulled into contact with the gate terminal (causing the device to malfunction), and the voltage at which the beam is pulled into contact with the drain terminal. The over-voltage factor is typically employed to define the maximum voltage that a micro-switch or micro-relay can safely withstand.

The over-voltage factor of the micro-switch 100 is further improved by positioning the gate terminal 104 near the distal end of the beam 108 and the drain terminal 106, and by positioning drain contacts 106a–106b of the drain terminal 106 in the area defined by the gate terminal 104. During actuation of the micro-switch 100, this configuration reduces the electrostatic forces acting near the center of the beam 108 relative to the electrostatic forces acting near the contact portion 108c of the beam 108.

As described above, at least the tip of the contact portion 108c of the beam 108 overhangs the drain terminal 106. During actuation of the micro-switch 100, the contact portion 108c comes into mechanical and electrical contact with the drain contacts 106a–106b to complete the circuit between the source terminal 102 and the drain terminal 106. Specifically, when an appropriate pull-in voltage is applied to the gate terminal 104, an electric field is established in the space between the gate terminal 104 and the contact portion 108c. When the electric field reaches a threshold value, the beam 108 deflects toward the drain terminal 106 until the contact portion 108c comes into contact with the drain contacts 106a–106b, thereby completing the circuit between the source terminal 102 and the drain terminal 106.

The micro-switch 100 may be packaged for interconnection to external circuitry (not shown). For example, bonding wires may connect the terminals 102, 104, and 106 to respective bonding pads mounted to the substrate. Further, printed circuit interconnections or additional bonding wires may connect the bonding pads to the external circuitry. A metalization layer may also be used to connect the micro-switch 100 to internal circuitry (not shown), e.g., a transistor, which may be formed on the substrate.

Figure 2A:
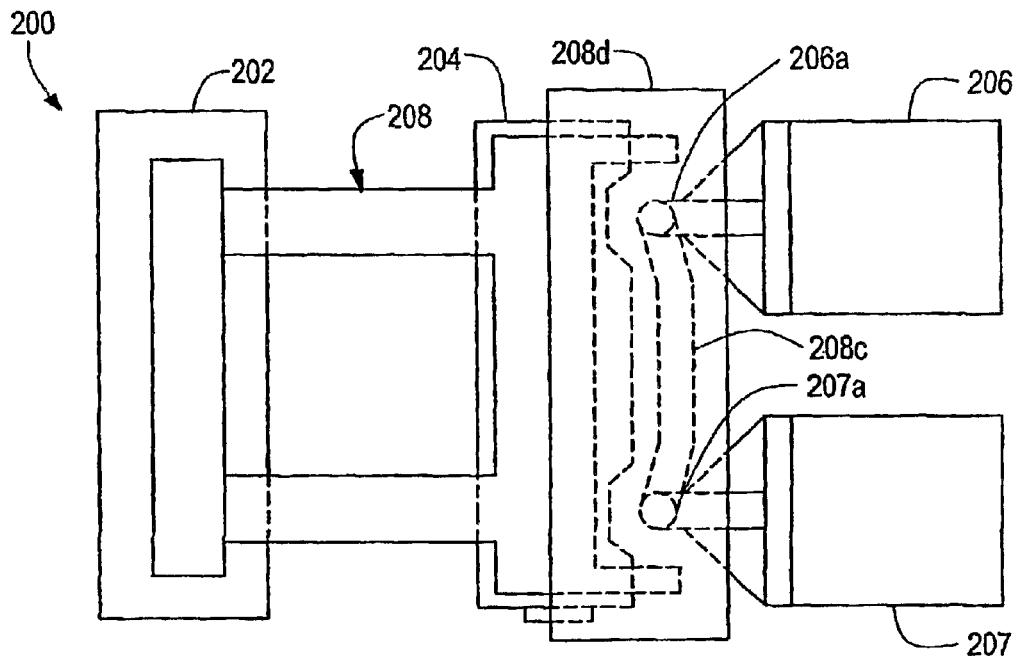
FIG. 2a is a top view of a conventional micro-relay.
Figure 2B:
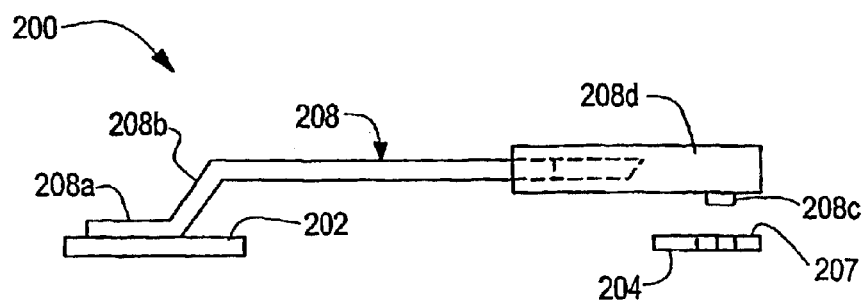

FIGS. 2a and 2b depict a conventional micro-relay 200 comprising a source terminal 202, a gate terminal 204, a first drain terminal 206, a second drain terminal 207, and a beam 208 mounted to a substrate (not shown). As shown in FIG. 2b, the beam 208 includes a fixed portion 208a fixedly attached to the source terminal 202 at a proximal end of the beam 208, and an insulative portion 208d overhanging the gate terminal 204 and the drain terminals 206 and 207 at a distal end of the beam 208. In the illustrated embodiment, the portion of the beam 208 extending from the source terminal 202 is split into two (2) parts and includes two (2) flexures 208b (see FIG. 2b). The insulative portion 208d electrically insulates the main part of the beam 208 from a contact portion 208c provided on a surface of the insulative portion 208d confronting drain contacts 206a and 207a.

Like the micro-switch 100, the micro-relay 200 comprises features that improve the over-voltage factor of the device. Specifically, the main part of the beam 208 is configured to be more rigid than the flexures 208b to prevent contact between the contact portion 208c and the gate terminal 204. Further, the gate terminal 204 is positioned near the distal end of the beam 208 and the drain terminals 206 and 207, and the drain contacts 206a and 207b are positioned in areas defined by the gate terminal 204 to reduce the electrostatic forces acting near the center of the beam 208 relative to the electrostatic forces acting near the contact portion 208c of the beam 208 during actuation of the micro-relay 200.

The contact portion 208c of the beam 208 confronts the drain contacts 206a and 207a and is capable of coming into mechanical and electrical contact with the drain contacts 206a and 207a to form an electrical connection therebetween. Specifically, when an appropriate pull-in voltage is applied to the gate terminal 204, an electric field is established in the space between the contact portion 208c of the beam 208 and the gate terminal 204. When the electric field reaches a threshold value, the beam 208 deflects toward the drain terminals 206 and 207 until the contact portion 208c comes into contact with the drain contacts 206a and 207a, thereby forming the electrical connection between the two (2) drain contacts 206a and 207a. It is noted that the insulative portion 208d of the beam 208 allows actuation of the micro-relay 200 independent of the drain contacts 206a and 207a.

Figure 3:
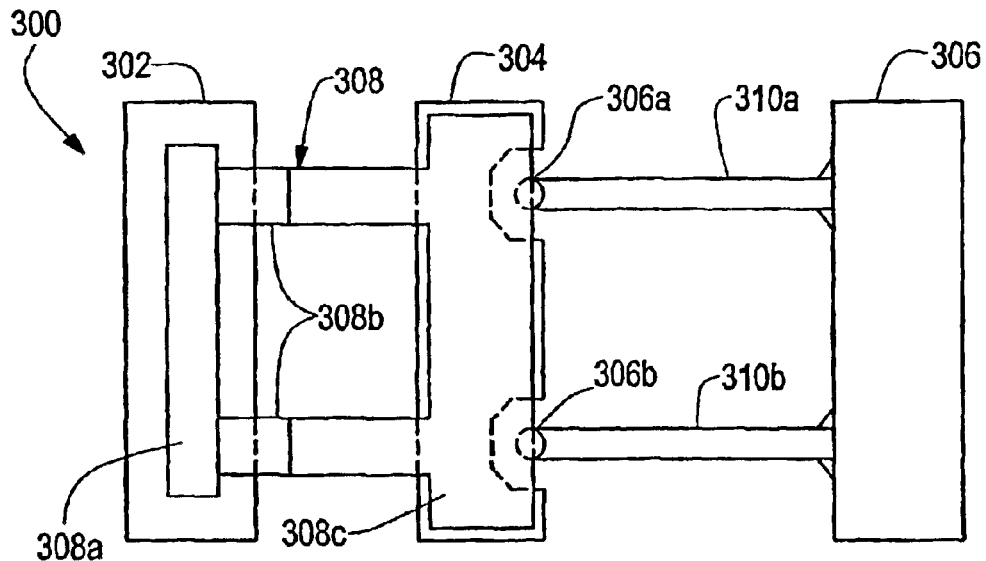
FIG. 3 is a top view of an electrostatic discharge protection device for protecting the micro-switch and micro-relay of FIGS. 1 and 2, in accordance with the present invention.

FIG. 3 depicts a top view of an ESD protection device 300 that can be employed to protect devices such as the micro-switch 100 (see FIGS. 1a–1b) and the micro-relay 200 (see FIGS. 2a–2b) from the adverse effects of ESD, in accordance with the present invention. The ESD protection device 300 comprises a passive, two (2) terminal switch including a source terminal 302, a drain terminal 306, and a beam 308 mounted to a substrate (not shown). Like the beam 108 of the micro-switch 100 (see FIGS. 1a–1b), the beam 308 of the ESD protection device 300 includes a fixed portion 308a fixedly attached to the source terminal 302 at a proximal end of the beam 308, and a contact portion 308c at least the tip of which overhangs the drain contacts 306a–306b at a distal end of the beam 308. Further, in a preferred embodiment, the portion of the beam 308 extending from the source terminal 302 is split into two (2) parts and includes two (2) flexures 308b. During actuation of the ESD protection device 300, the split portion reduces electrostatic forces acting near the center of the beam 308 relative to electrostatic forces acting near the contact portion 308c of the beam 308.

According to the present invention, the ESD protection device 300 is actuated in response to an ESD event to protect devices such as the micro-switch 100 (see FIGS. 1a–1b) and the micro-relay 200 (see FIGS. 2a–2b) from potential malfunction and/or damage due to the ESD event. For example, during the manufacture and assembly of the micro-switch 100 or micro-relay 200, an ESD event may cause an electrostatic charge to be transferred from one or more terminals of the device to another conducting object. Such an electrostatic charge may generate voltages that are large enough to cause the device to malfunction, breakdown the gate oxide of the device, or dissipate enough energy to produce electro-thermal failures in the device. Moreover, when the micro-switch 100 or micro-relay 200 is being used in the field, one or more drain terminals of the device may be used to connect internal systems implemented, e.g., on the same substrate as the device, to one or more external systems. This exposes the drain terminal of the micro-switch 100 or micro-relay 200 to potential ESD events that may cause malfunction in and/or damage to the device.

The two (2) terminal switch of the ESD protection device 300 is configured to close, in response to an ESD event, in less time than the device(s) it is protecting, thereby dissipating energy associated with the ESD event without causing malfunction in and/or damage to the protected device(s). Specifically, an ESD event causes a pull-in voltage to be generated at the source terminal 302 or the drain terminal 306 of the ESD protection device 300, thereby establishing an electric field in the space between the contact portion 308c of the beam 308 and the drain contacts 306a–306b. When the electric field reaches a threshold value, the beam 308 deflects until the contact portion 308c comes into mechanical and electrical contact with the drain contacts 306a–306b, thereby completing the circuit between the source terminal 302 and the drain terminal 306.

As described above, at least the tip of the contact portion 308c of the ESD protection device 300 overhangs the drain contacts 306a–306b of the drain terminal 306. In a preferred embodiment, the resulting overlap area of the drain contacts 306a–306b is configured to allow the two (2) terminal switch of the ESD protection device 300 to close at a predetermined voltage and in less time than the device(s) it is protecting.

The operation of the ESD protection device 300 will be better understood with reference to the following first illustrative example. In this first example, it is understood that the ESD protection device 300 is employed to protect the micro-switch 100 from adverse effects of an ESD event. It is further understood that the source terminal 302 of the ESD protection device 300 is electrically connected to the source terminal 102 of the micro-switch 100, and the drain terminal 306 of the ESD protection device 300 is electrically connected to the drain terminal 106 of the micro-switch 100.

In this first example, the ESD protection device 300 is employed to protect the drain terminal 106 of the micro-switch 100 from the adverse effects of the ESD event. Like the contact portion 308c of the ESD protection device 300, at least the tip of the contact portion 108c of the micro-switch 100 overhangs the drain contacts 106a–106b. Accordingly, in order to protect the drain terminal 106 of the micro-switch 100 from damage, the overlap area of the drain contacts 306a–306b of the ESD protection device 300 is made larger than the corresponding overlap area of the drain contacts 106a–106b of the micro-switch 100.

Because, in this first example, the drain terminal 306 of the ESD protection device 300 is electrically connected to the drain terminal 106 of the micro-switch 100, a pull-in voltage generated at the drain terminal 106, in response to the ESD event, causes respective electric fields to be established in the spaces between the contact portion 308c and the drain contacts 306a–306b of the ESD protection device 300, and between the contact portion 108c and the drain contacts 106a–106b of the micro-switch 100. Further, because the overlap area of the drain contacts 306a–306b is configured to be larger than the corresponding overlap area of the drain contacts 106a–106b, the magnitude of the respective electric field established in the ESD protection device 300 is greater than that of the respective electric field established in the micro-switch 100.

Because the electric field established in the ESD protection device 300 is stronger than the electric field established in the micro-switch 100, the electric field of the ESD protection device 300 reaches a threshold value before the electric field of the micro-switch 100, thereby causing the two (2) terminal switch of the ESD protection device 300 to close before the micro-switch 100. In a preferred embodiment, the overlap area of the drain contacts 306a–306b is determined to close the two (2) terminal switch of the ESD protection device 300 at a predetermined level of the pull-in voltage generated in response to the ESD event.

In an alternative embodiment, a spring constant or a mass associated with the beam 308 of the ESD protection device 300 may be configured to cause the two (2) terminal switch of the ESD protection device 300 to close before the micro-switch 100.

It should be understood that the ESD protection device 300 may be similarly employed to protect other devices such as the micro-relay 200 (see FIGS. 2a–2b) from adverse effects of ESD events.

In. the illustrated embodiment, the drain contacts 306a–306b of the ESD protection device 300 are configured to resist damage from the ESD event by current-limiting drain resistors 310a–310b coupled between the respective drain contacts 306a–306b and the drain terminal 306. For example, the drain resistors 310a–310b may be made of polysilicon or any other suitable material, and appropriate values of the drain resistors 310a–310b may be determined by the respective lengths of the resistors.

In an alternative embodiment, the drain contacts 306a–306b are disposed in respective primary conducting paths, a second set of drain contacts are disposed in respective high resistance paths in parallel with the primary conducting paths, and the respective current-limiting drain resistors 310a–310b are coupled between the second set of drain contacts and the drain terminal 306. Respective drain contact overlap areas associated with the drain contacts 306a–306b and the second set of drain contacts are configured to allow the high resistance paths to close before the primary conducting paths, thereby allowing the primary conducting paths to close safely to provide low resistance paths for current flow. In other alternative embodiments, the drain contacts of the ESD protection device 300 are configured to withstand ESD events by increasing the number of drain contacts and/or using alternate drain contact compositions. Increased numbers of drain contacts may also be provided to prevent unwanted collapse of the ESD protection device 300.

It is noted that the ESD protection device 300 optionally includes a gate terminal 304 mounted to the substrate. The optional gate terminal 304 may be employed to make closure of the two (2) terminal switch faster by suitably biasing the switch. Further, the optional gate terminal 304 may be employed to maintain actuation of the ESD protection device 300 while the drain terminal 306 removes excess electrostatic charge.

Still further, the optional gate terminal 304 of the ESD protection device 300 may be electrically connected to, e.g., the gate terminal 104 of the micro-switch 100. An ESD event at the gate terminal 104 may then cause a pull-in voltage to be generated at the gate terminal 304 to establish a threshold electric field in the space between the contact portion 308c of the beam 308 and the gate terminal 304, thereby protecting the gate terminal 104 of the micro-switch 100. The drain terminal 106 of the micro-switch 100 may also be protected in the event such a pull-in voltage at the drain terminal 106 is applied to the optional gate terminal 304 of the ESD protection device 300.

Figure 4:
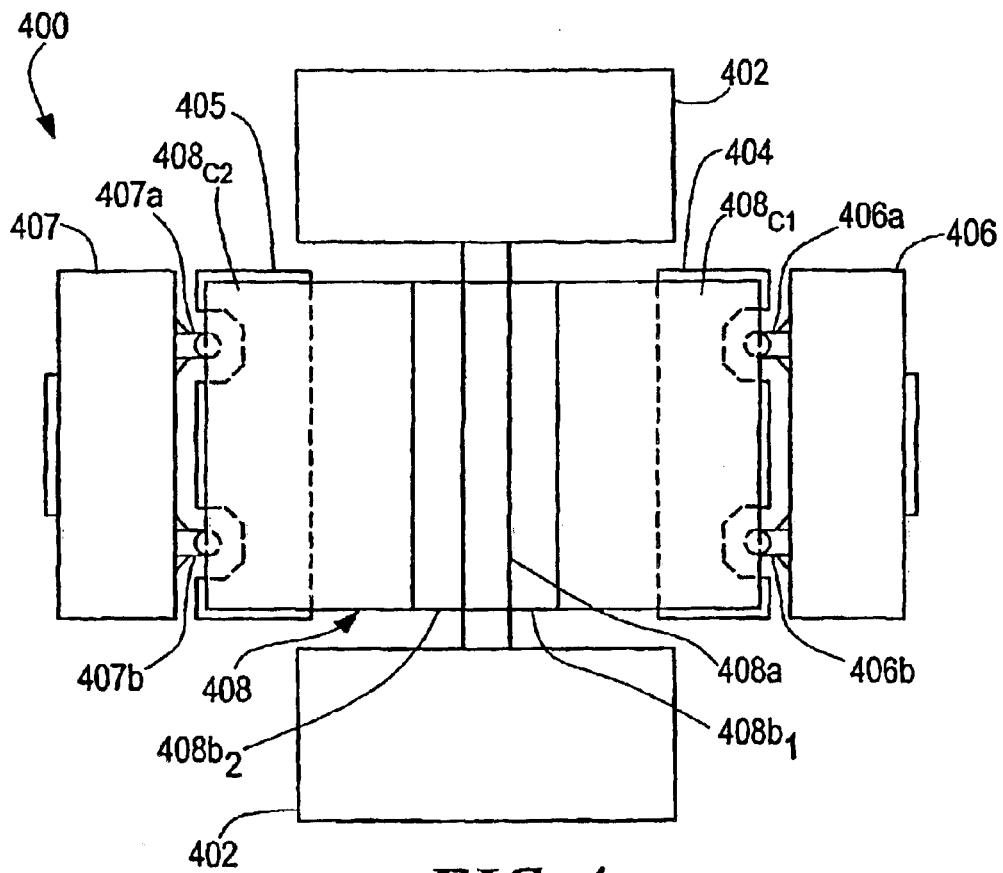
FIG. 4 is a top view of a micro-switch configured for reducing sensitivity to electrostatic discharge, in accordance with the present invention.

FIG. 4 depicts a top view of a micro-switch 400 configured for reducing sensitivity to ESD, in accordance with the present invention. In the illustrated embodiment, the micro-switch 400 comprises a "rocker switch" including a source terminal 402, a first gate terminal 404, a second gate terminal 405, a first drain terminal 406, a second drain terminal 407, and a beam 408 mounted to a substrate (not shown). The beam 408 of the micro-switch 400 includes a fixed portion 408a fixedly attached to the source terminal 402 at approximately the middle of the beam 408, a first flexure 408b1, a first contact portion 408c1 at least the tip of which overhangs the drain contacts 406a–406b, a second flexure 408b2, and a second contact portion 408c2 at least the tip of which overhangs the drain contacts 407a–407b.

The over-voltage factor of the micro-switch 400 is improved by making the main portion of the beam 408 rigid relative to the first and second flexures 408b1–408b2, by positioning the first gate terminal 404 near the drain terminal 406 and positioning the drain contacts 406a–406b in the area defined by the first gate terminal 404, and by positioning the second gate terminal 405 near the drain terminal 407 and positioning the drain contacts 407a–407b in the area defined by the second gate terminal 405.

According to the present invention, the micro-switch 400 is configured to be less sensitive to ESD events by using, e.g., the gate terminal 405 at one end of the rocker switch to latch that end of the device down. Such a configuration increases the pull-in voltage required to generate a threshold electric field to pull the other end of the rocker switch down. It should be understood that the gate terminal 404 may alternatively be used to latch one end of the rocker switch down to reduce the switch's sensitivity to ESD events.

Specifically, an appropriate pull-in voltage is applied at, e.g., the gate terminal 405 to establish an electric field in the space between the contact portion 408c2 of the beam 408 and the drain contacts 407a–407b of the drain terminal 407. When the electric field reaches a threshold value, the beam 408 deflects until the contact portion 408c2 comes into mechanical and electrical contact with the drain contacts 407a–407b, thereby latching that end of the rocker switch down. During operation, the other end of the rocker switch comprising the contact portion 408c1 of the beam 408 and the drain contacts 406a–406b of the drain terminal 406 is used for selectively completing the circuit between the source terminal 402 and the drain terminal 406.

The operation of the micro-switch 400 will be better understood with reference to the following second illustrative example. In this second example, it is understood that the gate terminal 405 is used to latch one end of the rocker switch down to reduce the switch's sensitivity to an ESD event. Accordingly, an appropriate first pull-in voltage is applied at the gate terminal 405 to establish a threshold electric field to pull the contact portion 408c2 of the beam 408 into contact with the drain contacts 407a–407b of the drain terminal 407.

Next, an appropriate second pull-in voltage is applied at the gate terminal 404 to establish an electric field to pull the contact portion 408c1 of the beam 408 into contact with the drain contacts 406a–406b of the drain terminal 406.

Those of ordinary skill in this art will appreciate that the above-described first and second pull-in voltages are normally proportional to the square root of the overlap areas of the drain contacts 407a–407b and the drain contacts 406a–406b, respectively. Because the gate terminal 405 is used to latch one end of the rocker switch down in response to the application of the first pull-in voltage, the second pull-in voltage associated with the gate terminal 404 is increased. In this second example, for a tip ratio of 0.5, the electrostatic force required to pull the contact portion 408c1 into contact with the drain contacts 406a–406b is increased by a factor of approximately ±3, and the second pull-in voltage is increased by a factor of approximately 1.5.

It is noted that because the contact portion 408c2 is pulled into contact with the drain contacts 407a–407b, the space between the contact portion 408c1 and the drain contacts 406a–406b is typically increased. In this second example, this increased spacing reduces the electrostatic force on the drain terminal 406 by a factor of approximately 2.25. As a result, the second pull-in voltage associated with the gate terminal 404 is typically further increased by a factor of approximately 2.6, e.g., to more than 200 volts. Such an increase in the pull-in voltage of the micro-switch 400 significantly reduces the switch's sensitivity to ESD.

The pull-in voltage of the micro-switch 400 may be further enhanced by, e.g., adding more drain contacts. Moreover, in this second example, the drain contacts 407a–407b may be omitted and bumpers may be added between the contact portion 408c2 of the beam 408 and the gate terminal 405 to prevent the beam 408 and the gate terminal 405 from coming into contact.

It should be understood that the device of FIG. 4 may be suitably modified to make a micro-relay with reduced sensitivity to ESD by, e.g., increasing the number of drain terminals in the device from two (2) to four (4).

The substrate of the ESD protection device 300 (see FIG. 3) and the micro-switch 400 (see FIG. 4) may be made of glass, silicon, or any other suitable substrate material. The beams 308 and 408 may be made of gold, nickel, chromium, copper, iron and/or any other suitable conductive material. Further, the source terminals 302 and 402; the gate terminals 304, 404, and 405; and, the drain terminals 306, 406, and 407 may be made of platinum, palladium, ruthenium, rhodium, gold or any other suitable material. The terminals 302, 304, 306, 402, 404, 405, 406, and 407 may be deposited on the respective substrates by any suitable method such as sputtering or chemical vapor deposition.

Figure 5:
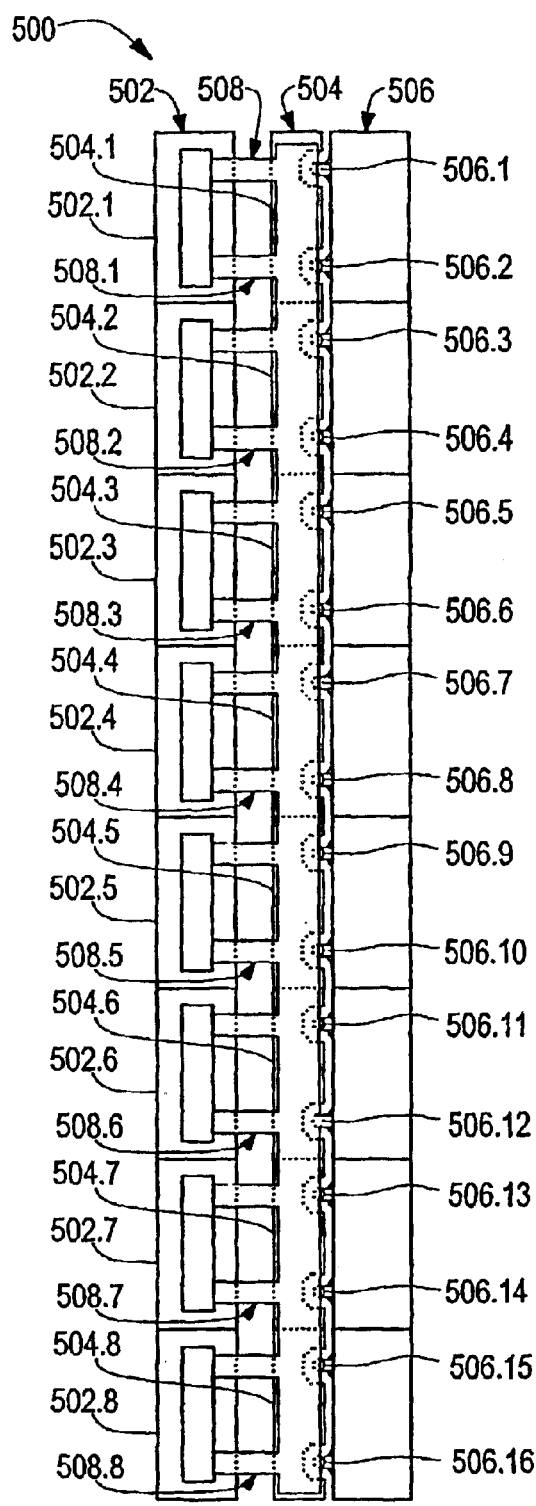
FIG. 5 is a top view of a conventional ganged switch having common beam, common source, common gate, and common drain terminals.

Conventional micro-switches such as the micro-switch 100 (see FIGS. 1a–1b) may be ganged together to allow the micro-switches to handle increased switching currents. FIG. 5 depicts a conventional ganged micro-switch 500 including a source terminal 502 comprising a plurality of source contacts 502.1–502.8, a gate terminal 504 comprising a plurality of gate contacts 504.1–504.8, a drain terminal 506 comprising a plurality of drain contacts 506.1–506.16, and a single beam 508 comprising a plurality of beams 508.1–508.8 mounted to a substrate (not shown). The beams 508.1–508.8 are fixedly attached at their proximal ends to a respective source contact, and overhang a respective gate contact at their distal ends with at least their tips overhanging respective drain contacts. The drain terminal 506 comprising the plurality of drain contacts 506.1–506.16 is electrically and mechanically connected to the respective beam when a large enough electrostatic force is established between the respective gate contact and the respective beam. It is noted that all contacts between the respective beams 508.1–508.8 and the respective drain contacts 506.1–506.2, 506.3–506.4, 506.5–506.6, 506.7–506.8, 506.9–506.10, 506.11–506.12, 506.13–506.14, and 506.15–506.16 are made or broken simultaneously so that switching currents are shared between all of the switches of the ganged micro-switch 500.

Figure 6:
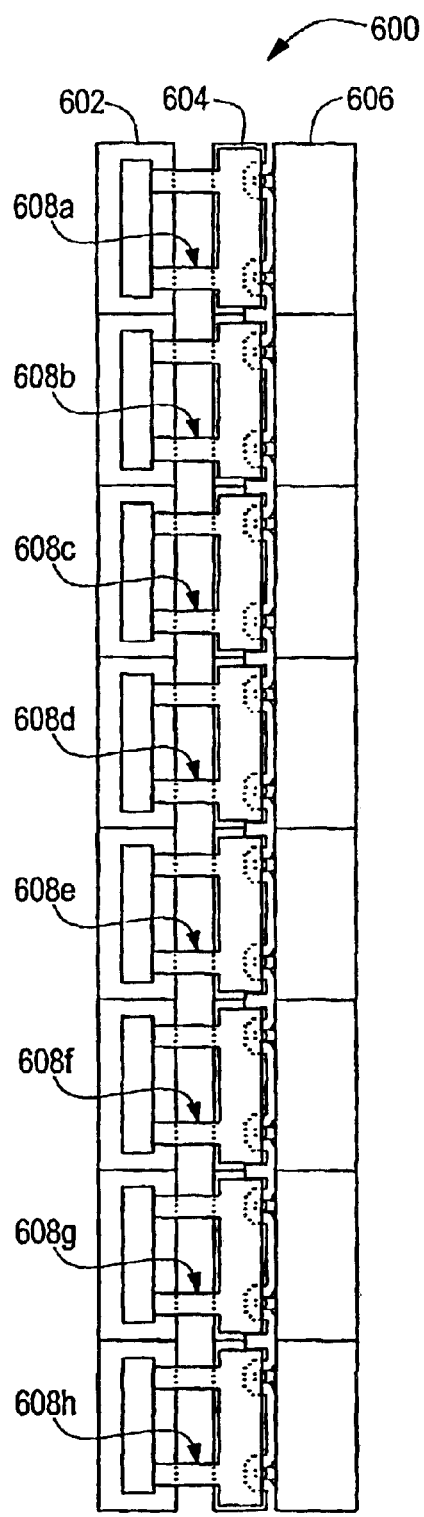
FIG. 6 is a top view of a conventional ganged switch having multiple beams and common source, common gate, and common drain terminals.

FIG. 6 depicts a conventional ganged micro-switch 600 including a source terminal 602, a gate terminal 604, a drain terminal 606, and multiple beams 608a–608h mounted to a substrate (not shown). The ganged micro-switch 600 is like the ganged micro-switch 500 (see FIG. 5) with the exception that the ganged switch 600 comprises the multiple beams 608a–608h while the ganged switch 500 comprises the single beam 508.

It is noted that the ESD protection device 300 (see FIG. 3) may be suitably configured, or a plurality of such ESD protection devices may be ganged together and electrically connected to the ganged micro-switch 500 or the ganged micro-switch 600 to reduce the ganged switches' sensitivity to ESD. It is further noted that conventional micro-relays such as the micro-relay 200 (see FIGS. 2a–2b) may be ganged together in the same manner as the ganged switches 500 and 600 to allow the micro-relays to handle increased currents.

Figure 7:
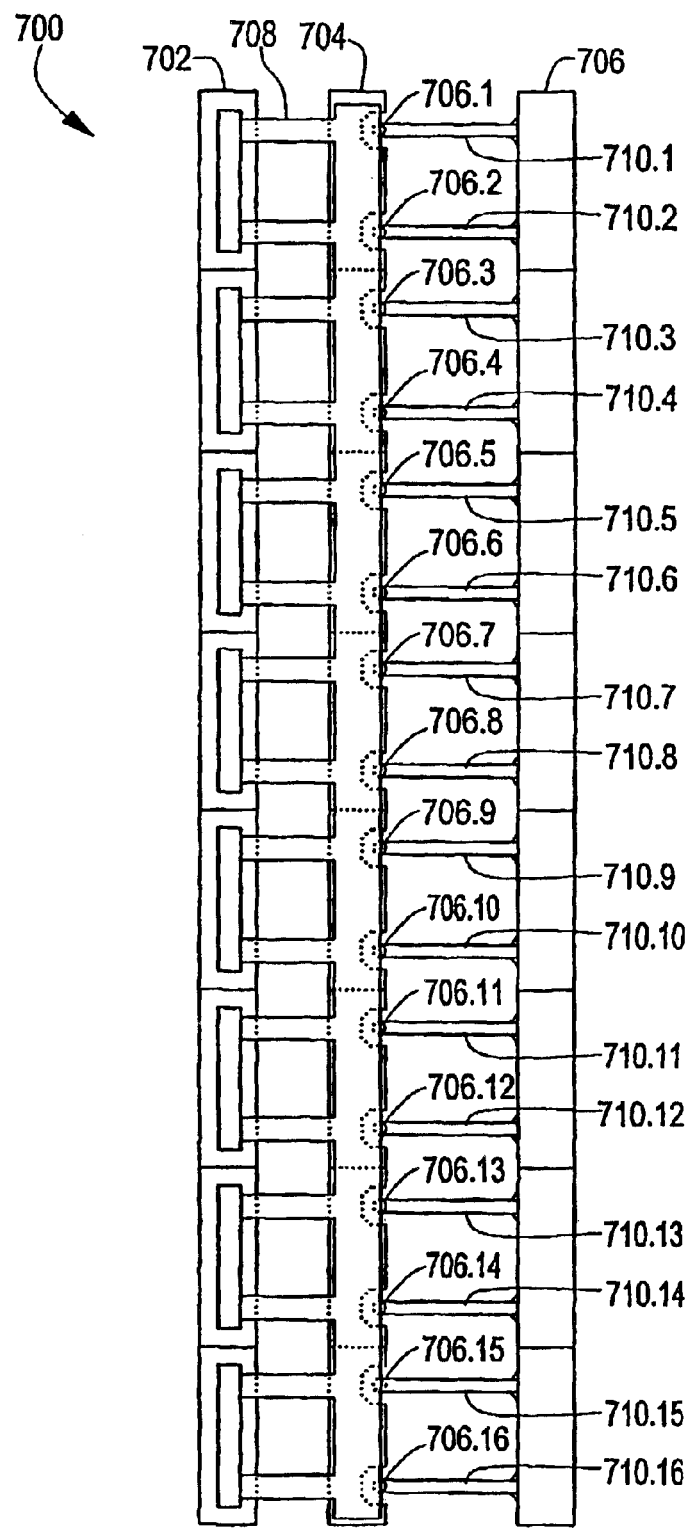
FIG. 7 is a top view of the ganged switch of FIG. 5 including integral resistors for reducing sensitivity to electrostatic discharge, in accordance with the present invention.
Figure 8:
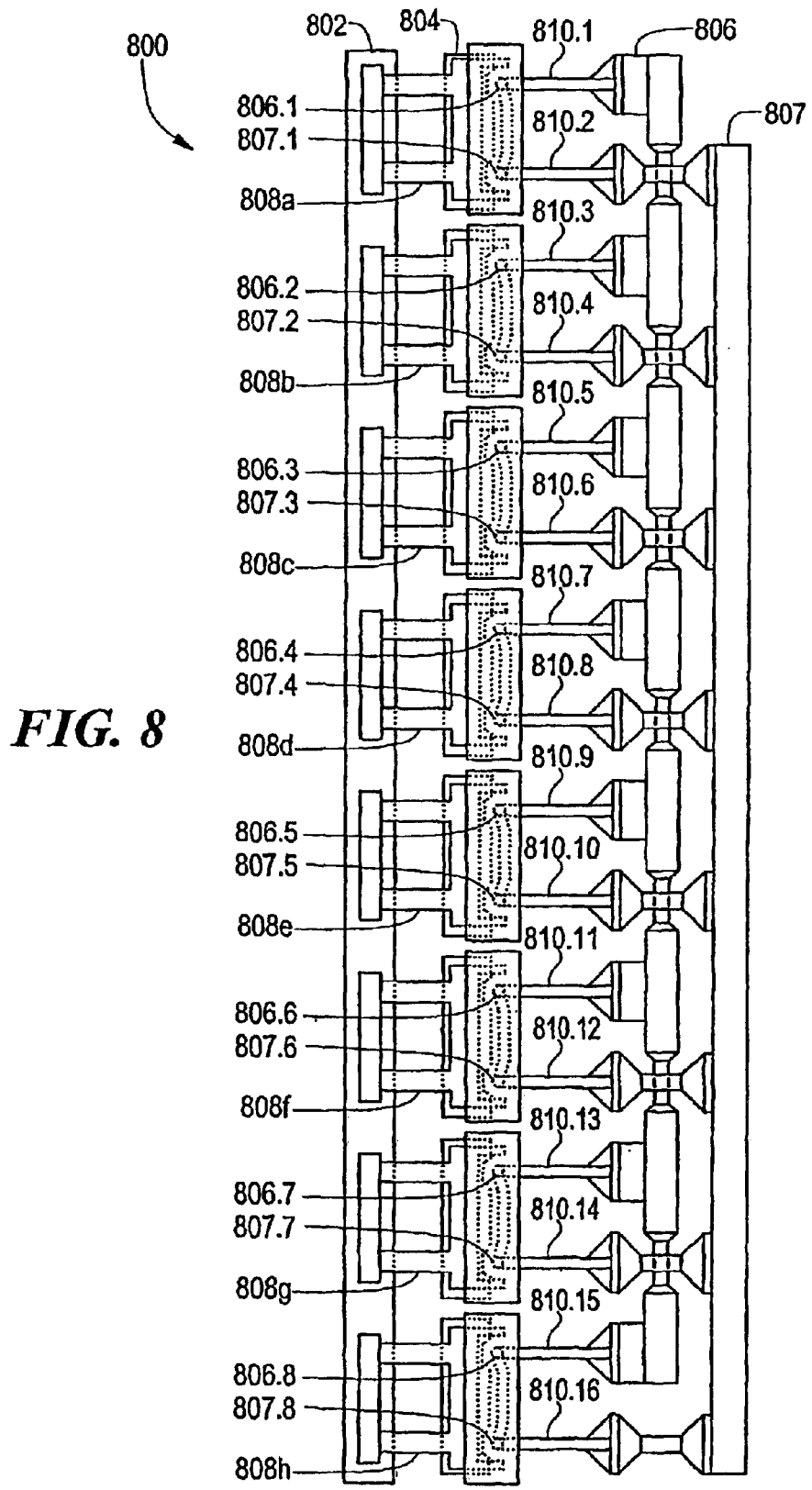
FIG. 8 is a top view of the ganged switch of FIG. 6 including integral resistors for reducing sensitivity to electrostatic discharge, in accordance with the present invention.

The drain contacts of the ganged micro-switches 500 and 600 may be configured to resist damage from ESD by including current-limiting drain resistors coupled between the respective drain contacts and the respective drain terminals. For example, FIG. 7 depicts a ganged micro-switch 700 that includes a source terminal 702, a gate terminal 704, a beam 708, and respective drain resistors 710.1–710.16 coupled between respective drain contacts 706.1–706.16 and a drain terminal 706 mounted to a substrate (not shown). Further, FIG. 8 depicts a ganged micro-relay 800 that includes a source terminal 802, a gate terminal 804, beams 808a–808h, respective drain resistors 810.1–810.8 coupled between respective drain contacts 806.1–806.8 and a first drain terminal 806, and respective drain resistors 810.9–810.16 coupled between respective drain contacts 807.1–807.8 and a second drain terminal 807 mounted to a substrate (not shown). The drain resistors 710.1–710.16 and 810.1–810.16 may be made of polysilicon or any other suitable material, and appropriate values of the drain resistors 710.1–710.16 and 810.1–810.16 may be determined by the respective lengths of the resistors such that the drain contacts 706.1–706.16, 806.1–806.8, and 807.1–807.8 have increased resistance to damage from ESD.

It should be understood that the drain contacts 706.1–706.16 of the ganged micro-switch 700 (see FIG. 7) may alternatively be disposed in respective primary conducting paths, a second set of drain contacts may be disposed in respective high resistance paths in parallel with the primary conducting paths, and respective current-limiting drain resistors may be coupled between the second set of drain contacts and the drain terminal 706. Respective drain contact overlap areas associated with the drain contacts 706.1–706.16 and the second set of drain contacts may then be configured to allow the high resistance paths to close before the primary conducting paths, thereby allowing the primary conducting paths to close safely to provide low resistance paths for current flow.

The drain contacts 806.1–806.8 and 807.1–807.8 of the ganged micro-relay 800 (see FIG. 8) may similarly be disposed in respective primary conducting paths, a second set of drain contacts may be disposed in respective high resistance paths in parallel with the primary conducting paths, and respective current-limiting drain resistors may be coupled between the second set of drain contacts and the drain terminals 806 and 807. Respective drain contact overlap areas associated with the drain contacts 806.1–806.8 and 807.1–807.8 and the second set of drain contacts may then be configured to allow the high resistance paths to close before the primary conducting paths to allow the primary conducting paths to close safely and provide low resistance paths for current flow.

It will further be appreciated by those of ordinary skill in the art that modifications to and variations of the above-described apparatus and methods may be made without departing from the inventive concepts disclosed herein. Accordingly, the invention should not be viewed as limited except as by the scope and spirit of the appended claims.

What is claimed is:

1. A protection device for providing electrostatic discharge (ESD) protection to a micro-mechanical device, the micro-mechanical device including a first electrode and a second electrode mounted on a first substrate, and a first beam having a first end attached to the first electrode and a second end overhanging the second electrode to define a first overlap area, the protection device comprising:
   a first terminal mounted on a second substrate and electrically connectable to the first electrode of the micro-mechanical device;
   a second terminal mounted on the second substrate and electrically connectable to the second electrode of the micro-mechanical device; and
   a second beam having a first end attached to the first terminal and a second end overhanging at least a portion of the second terminal when in a first position to define a second overlap area, the second beam being electro-statically deflectable in response to an ESD event from the first position to a second position to make contact with the second terminal,
   wherein the second overlap area is greater than the first overlap area.

2. The protection device of claim 1 wherein the first substrate and the second substrate comprise the same substrate.

3. The protection device of claim 1 wherein the first end of the second beam includes at least one flexure attached to the first terminal.

4. The protection device of claim 1 wherein the first terminal comprises a source terminal and the second terminal comprises a drain terminal.

5. The protection device of claim 1 wherein the second overlap area is configured to allow the second beam to deflect from the first position to the second position when the ESD event causes a predetermined voltage level to be applied at one of the first and second terminals.

6. The protection device of claim 1 wherein the second terminal includes a terminal portion and at least one contact portion, and a respective resistive element is coupled between the terminal portion and the at least one contact portion.

7. The protection device of claim 1 wherein the second terminal includes a terminal portion, at least one first contact portion, and at least one second contact portion, and a respective resistive element is coupled between the terminal portion and the at least one second contact portion.

8. The protection device of claim 1 further including a third terminal configured to apply a bias voltage to the protection device.

9. The protection device of claim 8 wherein the third terminal comprises a gate terminal.

10. The protection device of claim 1 wherein the micro-mechanical device comprises a micro-switch.

11. The protection device of claim 1 wherein the micro-mechanical device comprises a micro-relay.

12. The protection device of claim 1 wherein the micro-mechanical device further includes a third electrode mounted on the first substrate, and the second terminal of the protection device is electrically connectable to the third electrode.

13. The protection device of claim 1 wherein the second beam has an associated spring constant, and the associated spring constant is determined to increase the speed of deflection of the second beam.

14. The protection device of claim 1 wherein the second beam has an associated mass, and the associated mass is determined to increase the speed of deflection of the second beam.

15. A micro-mechanical device configured to be less sensitive to electrostatic discharge (ESD) events, comprising:
   a first pair of terminals mounted on a substrate;
   a second pair of terminals mounted on the substrate;
   a center terminal mounted on the substrate between the first and second pairs of terminals; and
   a beam having a center portion attached to the center terminal, a first end being deflected to make contact with a first terminal of the first terminal pair by an electrostatic field established between the first end and a second terminal of the first terminal pair, and a second end overhanging the second terminal pair when in a first position and being deflectable to make contact with a first terminal of the second terminal pair by an electrostatic field established between the second end and a second terminal of the second terminal pair,
   wherein the first end of the beam is deflected so as to increase a pull-in voltage required to pull the second end of the beam into contact with the first terminal of the second terminal pair, thereby reducing the sensitivity of the device to ESD events.

16. The micro-mechanical device of claim 15 further including at least one first flexure attached to the center terminal and disposed between the first end and the center terminal, and at least one second flexure attached to the center terminal and disposed between the second end and the center terminal.

17. The micro-mechanical device of claim 15 wherein the center terminal comprises a source terminal, the first terminals of the first and second terminal pairs comprise respective drain terminals, and the second terminals of the first and second terminal pairs comprise respective gate terminals.

18. The micro-mechanical device of claim 15 wherein the micro-mechanical device comprises a micro-switch.

19. The micro-mechanical device of claim 15 wherein the micro-mechanical device comprises a micro-relay.

20. The micro-mechanical device of claim 19 further including an insulator disposed between the second end of the beam and the center portion of the beam.

* * * * *

UNITED STATES PATENT AND TRADEMARK OFFICE
CERTIFICATE OF CORRECTION

PATENT NO. : 6,836,394 B2 Page 1 of 1
APPLICATION NO. : 10/220910
DATED : December 28, 2004
INVENTOR(S) : Nicol E. McGruer et al.

It is certified that error appears in the above-identified patent and that said Letters Patent is hereby corrected as shown below:

Title Page, Title (54), "PROTECTION FOR ELETROSTATICALLY" should read --PROTECTION FOR ELECTROSTATICALLY--;

Column 1, Title, "PROTECTION FOR ELETROSTATICALLY" should read --PROTECTION FOR ELECTROSTATICALLY--;

Signed and Sealed this

First Day of September, 2009

David J. Kappos
*Director of the United States Patent and Trademark Office*